US010387485B2

(12) United States Patent
Goyal et al.

(10) Patent No.: US 10,387,485 B2
(45) Date of Patent: Aug. 20, 2019

(54) COGNITIVE IMAGE SEARCH REFINEMENT

(71) Applicant: International Business Machines Corporation, Armonk, NY (US)

(72) Inventors: Munish Goyal, Yorktown Heights, NY (US); Wing L. Leung, Austin, TX (US); Sarbajit K. Rakshit, Kolkata (IN); Kimberly Greene Starks, Nashville, TN (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 15/464,708

(22) Filed: Mar. 21, 2017

(65) Prior Publication Data
US 2018/0276247 A1 Sep. 27, 2018

(51) Int. Cl.
*G06F 3/048* (2013.01)
*G06F 16/583* (2019.01)
*G06F 3/01* (2006.01)
*G06K 9/00* (2006.01)
*G06F 17/50* (2006.01)
*G06F 3/03* (2006.01)

(52) U.S. Cl.
CPC ......... *G06F 16/5854* (2019.01); *G06F 3/013* (2013.01); *G06F 3/017* (2013.01); *G06F 3/0304* (2013.01); *G06F 17/50* (2013.01); *G06K 9/00214* (2013.01); *G06K 9/00355* (2013.01)

(58) Field of Classification Search
CPC ...... G06F 3/013; G06F 3/017; G06K 9/00355
USPC ......................................... 715/719
See application file for complete search history.

(56) References Cited

U.S. PATENT DOCUMENTS

| 9,323,784 | B2 | 4/2016 | King et al. | |
|---|---|---|---|---|
| 2008/0013793 | A1* | 1/2008 | Hillis | G03H 1/0005 382/114 |
| 2012/0194418 | A1* | 8/2012 | Osterhout | G02B 27/0093 345/156 |
| 2014/0347265 | A1 | 11/2014 | Aimone et al. | |

(Continued)

OTHER PUBLICATIONS

Mell et al., "The NIST Definition of Cloud Computing", National Institute of Standards and Technology, U.S. Dept. of Commerce, NIST Special Publ. 800-145, Sep. 2011, 7 pages.

(Continued)

*Primary Examiner* — Alex Olshannikov
(74) *Attorney, Agent, or Firm* — Heslin Rothenberg Farley & Mesiti P.C.; Brian Restauro, Esq.

(57) ABSTRACT

A method, computer program product, and system includes a processor(s) monitoring, via an image capture device communicatively coupled to the one or more processors, visual focus of a user to identify a focal point of a user on an area of an image of at least one object displayed in a graphical user interface communicatively coupled to the one or more processors. The processor(s) derives shape geometry of the object, creating a three-dimensional model. The processor(s) obtains, via the image capture device, a physical gesture by the user. The processor(s) performs a contextual analysis of the physical gesture to determine an application of the physical gesture to a portion of the object depicted in the area of the image. The processor(s) formulates search criteria, based on determining the application and the area. The processor(s) execute a search based on the search criteria and display by a search result.

16 Claims, 8 Drawing Sheets

(56) References Cited

U.S. PATENT DOCUMENTS

2017/0177197 A1* 6/2017 Waggoner ........... G06F 3/04842
2018/0189354 A1* 7/2018 Paine ................ G06F 17/30519

OTHER PUBLICATIONS

Pattern Recognition, Wikipedia, https://en.wikipedia.org/w/index.php?title=Pattern_recognition&printabl . . . printed Aug. 30, 2016, 7 pages.

Edge Detection, Wikipedia, https://en.wikipedia.org/w/index.php?title=Edge_detection&printable=yes, printed on Aug. 30, 2016, 7 pages.

Image Recognition—MATLAB, http://www.mathworks.com/discovery/image-recognition.html?requeste . . . printed Aug. 30, 2016, 3 pages.

Method and System for Retrieving Refined Search Results by Using Previous Results Within a User's Social Circle, IPCOM000218109D, May 21, 2012, 2 pages.

Searching Images Based on Refining Desired Image Charcteristics, IPCOM000213425D, Dec. 14, 2011, 4 pages.

* cited by examiner

US 10,387,485 B2

COGNITIVE IMAGE SEARCH REFINEMENT

BACKGROUND

When performing an image search, it can be challenging to express search criteria using words or in written search terms. This challenge is especially apparent when a user reviews results from an initial search and attempts to further tune the results to fit the desired criteria.

SUMMARY

Shortcomings of the prior art are overcome and additional advantages are provided through the provision of a method for refining an image search. The method includes, for instance: monitoring, by one or more processors, via an image capture device communicatively coupled to the one or more processors, visual focus of a user to identify a focal point of a user on an area of an image displayed in a graphical user interface communicatively coupled to the one or more processors, wherein the image comprises at least one object; deriving, by the one or more processors, shape geometry of the at least one object and utilizing the shape geometry to create a three-dimensional model of the at least one object; obtaining, by the one or more processors, via the image capture device, a physical gesture by the user; performing, by the one or more processors, a contextual analysis of the physical gesture, wherein the contextual analysis comprises determining, based on the three dimensional model, an application of the physical gesture to a portion of the at least one object depicted in the area of the image; formulating, by the one or more processors, search criteria, based on determining the application of the physical gesture to the portion of the at least one object and the area of the image; executing, by the one or more processors, a search based on the search criteria in at least one data source comprising images; and displaying, by the one or more processors, in the graphical user interface, a search result of the search comprising at least one new image.

Shortcomings of the prior art are overcome and additional advantages are provided through the provision of a computer program product for refining an image search. The computer program product comprises a storage medium readable by a processing circuit and storing instructions for execution by the processing circuit for performing a method. The method includes, for instance: monitoring, by one or more processors, via an image capture device communicatively coupled to the one or more processors, visual focus of a user to identify a focal point of a user on an area of an image displayed in a graphical user interface communicatively coupled to the one or more processors, wherein the image comprises at least one object; deriving, by the one or more processors, shape geometry of the at least one object and utilizing the shape geometry to create a three-dimensional model of the at least one object; obtaining, by the one or more processors, via the image capture device, a physical gesture by the user; performing, by the one or more processors, a contextual analysis of the physical gesture, wherein the contextual analysis comprises determining, based on the three dimensional model, an application of the physical gesture to a portion of the at least one object depicted in the area of the image; formulating, by the one or more processors, search criteria, based on determining the application of the physical gesture to the portion of the at least one object and the area of the image; executing, by the one or more processors, a search based on the search criteria in at least one data source comprising images; and displaying, by the one or more processors, in the graphical user interface, a search result of the search comprising at least one new image.

Methods and systems relating to one or more aspects are also described and claimed herein. Further, services relating to one or more aspects are also described and may be claimed herein.

Additional features are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
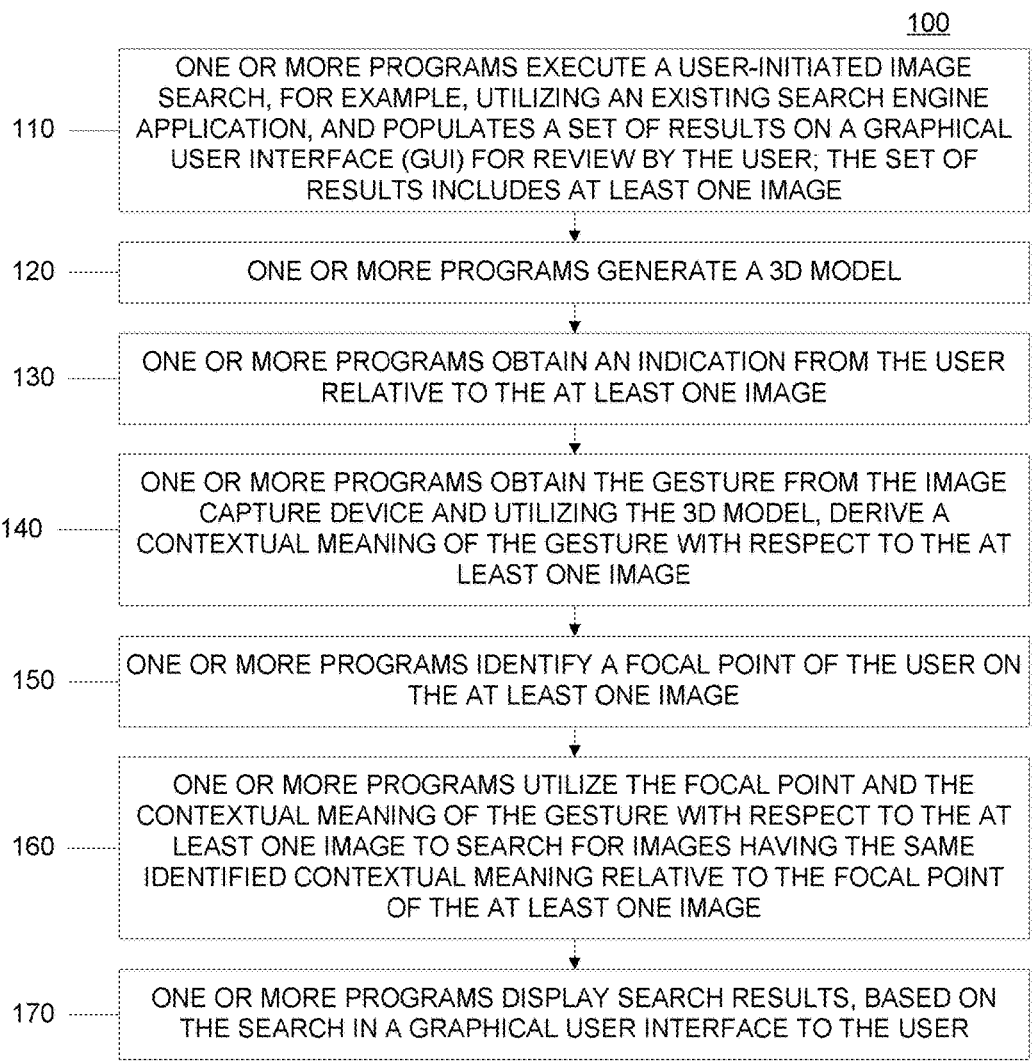
FIG. 1 is a workflow illustrating certain aspects of an embodiment of the present invention.

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

Figure 6:
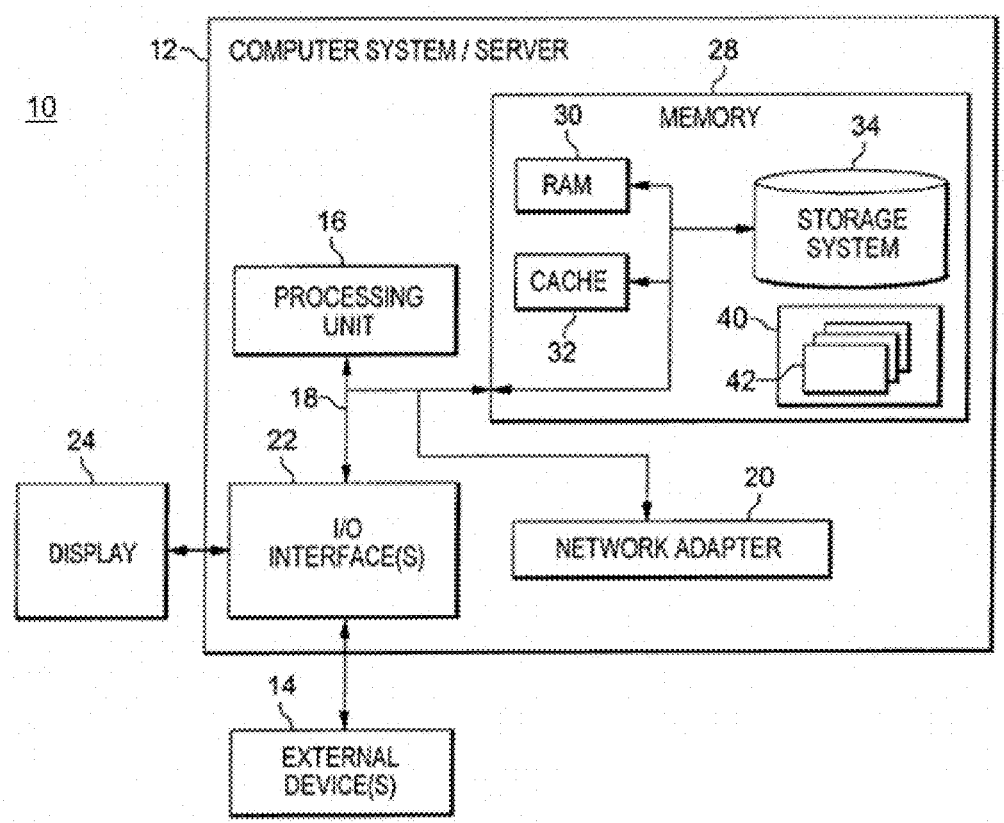
FIG. 6 depicts one embodiment of a computing node that can be utilized in a cloud computing environment.

As understood by one of skill in the art, program code, as referred to throughout this application, includes both software and hardware. For example, program code in certain embodiments of the present invention includes fixed function hardware, while other embodiments utilized a software-based implementation of the functionality described. Certain embodiments combine both types of program code. One example of program code, also referred to as one or more programs, is depicted in FIG. 6 as program/utility 40, having a set (at least one) of program modules 42, may be stored in memory 28.

Embodiments of the present invention include a computer system, a computer-implemented method, and a computer program product that include one or more programs that receive a search query for images by a user, based on the query, generate a set of image search results which may include a plurality of images, and filter the set of image search results, based on the detecting gestures (including eye movements) of a user of the computing device that executed the one or more programs. In an embodiment of the present invention, the one or more programs may detect these gestures by a detecting a movement of the user and/or eye gaze of the user that corresponds to the movement, where the eye gaze is focused on a portion of an image within the set of image search results. Hence, embodiments of the present invention include a computer system, a computer-implemented method, and a computer program product where one or more programs execute a cognitive method by which a user can express additional image search requirements with body language, including but not limited to, hand and finger movements, to refine search results. In embodiments of the present invention, one or more programs may both initiate an image search, filter search results from a previously initiated image search, and manipulate images that are the result of the previously executed image search, based on applying real-time (or near real-time) gestures and body movements, as criteria, to execute, filter, or manipulate criteria and/or results sets.

Aspects of some embodiments of the present invention represent advantages over existing image search and image search result refinement methods. For example, as will be discussed further, in embodiments of the present invention, one or more programs executed by at least one processing circuit in a computer system separate portions of images cognitively into component parts/areas. Breaking the images down in this manner enables novel functionality that is not available in existing search and search refinement systems. By breaking images down into more granular pieces, the pieces can form the basis of searches or the filtering or manipulation of search results. One or more programs can weigh these components in searches and search refinements, based on a user's real-time reactions to the images, including the user's physical gestures. Separating out portions of an image or breaking down the image also enables the one or more programs in an embodiment of the present invention to detect how these components move in relation to each other, enabling another avenue for search and search result refinement. In an embodiment of the present invention, one or more programs apply various algorithms to break down images into the aforementioned functional components. The one or more programs then enable a user to manipulate these components via visual detection and/or physical gestures. The one or more programs receive and interpret the actions of the user and leverage these data to refine searches and search result sets.

Embodiments of the present invention are inextricably tied to computing based at least on addressing the computing-specific issue of performing and refining image searches on a computing network, including but not limited to, on the Internet. Embodiments of the present invention integrate motion sensing technologies and data analyses into these searches to approach this challenge to create a more effective image searching and search result refinement approach that increases the efficiency of the computing system executing the search.

FIG. 1 is a workflow 100 that illustrates several aspects of embodiments of the present invention. As seen in FIG. 1, in an embodiment of the present invention, one or more programs interpret and apply three dimensional (3D) gestures and body movements of a user to image search results for refinement of a results set. FIG. 1 also illustrates that one or more programs in an embodiment of the present invention manipulate images displayed in search results based on 3D gestures and body movements of a user.

Figure 2:
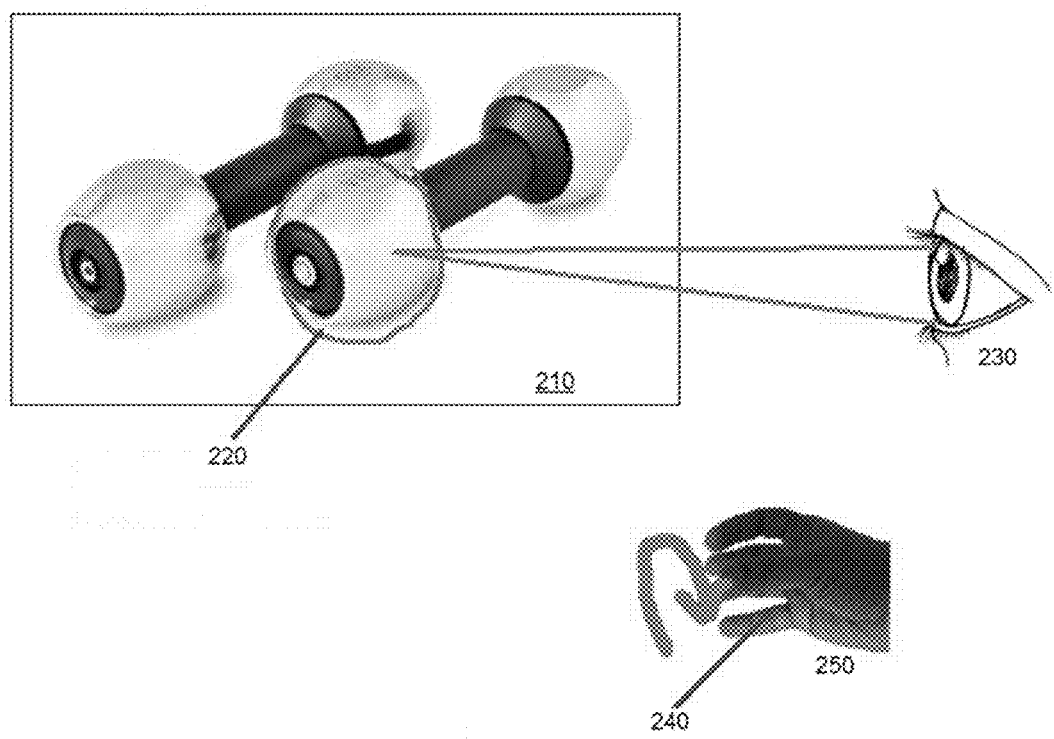
FIG. 2 is an illustration of certain aspects of an embodiment of the present invention.

Referring to FIG. 1, in an embodiment of the present invention, one or more programs execute a user-initiated image search, for example, utilizing an existing search engine application, and populate a set of results on a graphical user interface (GUI) for review by the user; the set of results includes at least one image (110). FIG. 2 illustrates at least one image 210 as an example of a search result for this query. As seen in FIG. 2, the at least one image 210 is displayed within the user's visual range 230. In the case of FIG. 2, the image is of weights that can be utilized in a gym setting.

Returning to FIG. 1, from the at least one image, the one or more programs generate a 3D model (120). The one or more programs obtain an indication from the user relative to the at least one image (130). In an embodiment of the present invention, the indication that the one or more programs receive is a gesture, which is captured by an image capture device, such as a camera, communicatively coupled to one or more processors executing the one or more programs. The one or more programs obtain the gesture from the image capture device and utilizing the 3D model, derive a contextual meaning of the gesture with respect to the at least one image (140). FIG. 2 illustrates a gesture 240, in this example, formulated by the hand 250 of a user, who views the at least one image 210 through a graphical user interface (GUI), as a search result.

Returning again to FIG. 1, in an embodiment of the present invention, the one or more programs identify a focal point of the user on the at least one image (150). In an embodiment of the present invention, the one or more programs make this identification based on data from the aforementioned image capture device. FIG. 2 illustrates an example of a focal point 220 of the at least one image 210, which was displayed to a user. The one or more programs determine the user's visual range 230 and focus to locate the portion of the at least one image 210 that is the focal point 220 for this user. Put another way, the one or more programs determine what portion of the image 210 the user is looking at.

As illustrated in FIG. 1, the one or more programs utilize the focal point (e.g., FIG. 2, 220) and the contextual meaning of the gesture with respect to the at least one image to search for images having the same identified contextual meaning relative to the focal point of the at least one image (160). FIG. 2 provides an example of how the one or more programs interpret a combination of a gesture 240 and a focal point 220, to generate search criteria for further searches.

As seen in FIG. 2, the focal point 210 of the user's visual range 230 is on an end of one item in the image 210. Meanwhile, the gesture 240 the user is making with his or her hand 250, indicates that the user is seeking search results where the focal point 220 of the image 210 rotates. Thus, the one or more programs, in this example, perform one or more additional searches with a focus on obtaining images that focus on focal point 220, rotating in accordance with the gesture 240.

More specifically, as illustrated in FIG. 2, a user has performed a 3D hand gesture while looking at a particular portion, the focal point 220, of the image 210. The one or more programs obtain the data from an image capture device and derive a contextual meaning for the gesture, with respect to the image 210. Because the user has looked at the end circular portion, the focal point 220, of the image 210, and performed a finger rotation gesture 240, the one or more programs determine that the user seeks an image, where an end circular portion (similar to the focal point 220) rotates (as indicated by the gesture 240). Items that look similar to the focal point 220, but rotate, include wheels mounted on bearings; the weights pictured in the image 210 do not include this feature.

Returning to FIG. 1, the one or more programs display search results (e.g., in a GUI), based on the search (170). If the search results do not include an image that is acceptable to the user, the one or more programs may continue to refine the results. For example, the one or more programs may continue to monitor the focus and movement of a user and make adjustments to tune further the searches performed. In an embodiment of the present invention, as part of this search, the one or more programs generate one or more sets of search queries, based on the contextual meaning of the gesture with respect to the image portion (focal point), and will search for images where the same image portion has the contextual meaning. In an embodiment of the present invention, based on additional data received from an image capture device communicatively coupled to one or more processors executing the program code of the present invention, the one or more programs may change the focal point and automatically perform a search based on the changed focal point and/or additional 3D gestures.

Figure 3:
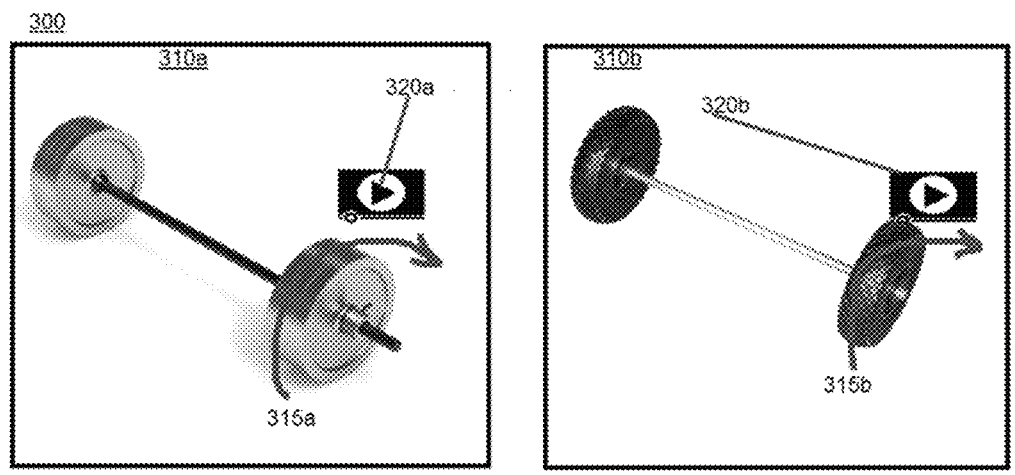
FIG. 3 is an illustration of certain aspects of an embodiment of the present invention.

FIG. 3 is an example of search results 300 that the one or programs may display to a user, based on the one or more programs in an embodiment of the present invention refining the search by utilizing the criteria illustrated in FIG. 2. As seen in FIG. 3, based on the focal point 220 (FIG. 2), and the gesture 240 (FIG. 2), the one or more programs have returned images 310*a*-310*b* with a similar shape to the focal point 220 (FIG. 2), but with the rotational feature 315*a*-315*b* indicated in the gesture 240 (FIG. 2). In FIG. 3, a first search result 310*a* is an image of weights, like the original image 210 (FIG. 2), but with a rotational feature 315*a*. Meanwhile, the second search result 310*b*, is an image of a wheel, which has the same shape as the focal point 220 (FIG. 2), and has the rotational feature 315*b* indicated by the gesture 240 (FIG. 2). To illustrate further the relevance of the search results to the refined search criteria, the one or more programs may overlay one or more video clips 320*a*-320*b* on the image search results 310*a*-310*b* to show the properties of a portion of the image are in concert with the focal point 220 (FIG. 2) and gesture 240 (FIG. 2) used to originate the search. In FIG. 3, if a user selects either of the video clips 320*a*-320*b*, the one or more programs will display the rotational feature of the item in the search result 310*a*-320*b* to the user.

Figure 4:
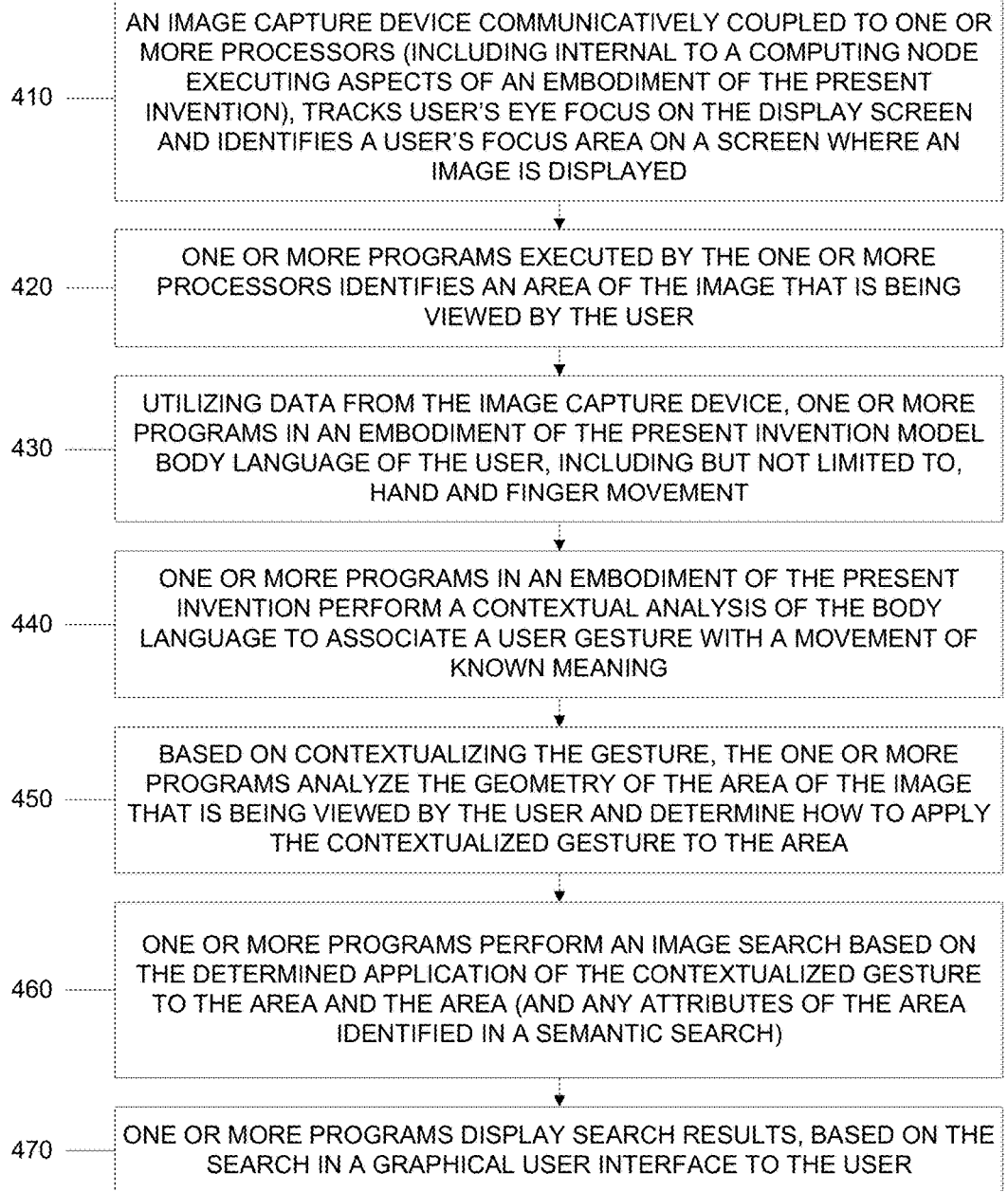
FIG. 4 a workflow illustrating certain aspects of an embodiment of the present invention.

FIG. 4 is a workflow 400 that illustrates aspects of some embodiments of the present invention. In an embodiment of the present invention, an image capture device communicatively coupled to one or more processors (including internal to a computing node executing aspects of an embodiment of the present invention), tracks user's eye focus on the display screen and identifies a user's focus area on a screen where an image is displayed (410). Based on the tracking data, one or more programs executed by the one or more processors identifies an area of the image that is being viewed by the user (420). In an embodiment of the present invention, the one or more programs utilize object boundary and object recognition method techniques to identify the area of the image. One object boundary and object recognition method that can be executed by the one or more programs to identify the area is edge detection. As understood by one of skill in the art, edge detection includes a variety of mathematical methods that aim at identifying points in a digital image at which the image brightness changes sharply or, more formally, has discontinuities. The program code organizes the points at which image brightness changes sharply into a set of curved line segments termed edges. In certain embodiments of the present invention, the one or more programs identify the area of the image being viewed utilizing a combination of the movement of the user's eyes and edge detection on the image.

In embodiments of the present invention, the one or more programs detect the shape and geometry of the area with the context of the entire image. In order to locate the area within the image, one or more programs in embodiments of the present invention may take advantage of existing object recognition techniques utilized with digital images. For example, in applying one such technique, the one or more programs read/capture the image, convert the color (e.g., RGB) image to black and white, recognize boundaries of objects in the image, find areas of objects and perform area filtering, find inclinations of objects, find bounding boxes for the objects, find ratios of areas for each of the given objects, and perform color recognitions on the objects and areas.

Figure 5:
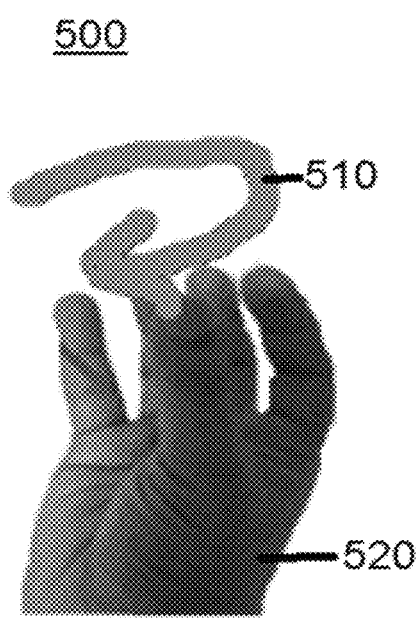
FIG. 5 is an illustration of certain aspects of an embodiment of the present invention.

Returning to FIG. 4, utilizing data from the image capture device, one or more programs in an embodiment of the present invention model body language of the user, including but not limited to, hand and finger movement (430). The data from the image capture device is the result of the image capture device detecting movement of the user. One or more programs in an embodiment of the present invention perform a contextual analysis of the body language to associate a user gesture with a movement of known meaning (440). For example, FIG. 5 shows an example of body language 500 that the one or more programs will contextualize. In this non-limiting example, the image capture device captures a user rotating 510 his or her hand 520. The one or more programs contextualize this gesture to mean that the user intends that the identified area of the image can be rotated in accordance with the gesture.

Returning to FIG. 4, based on contextualizing the gesture, the one or more programs analyze the geometry of the area of the image that is being viewed by the user and determine how to apply the contextualized gesture to the area (450). Returning to FIG. 2, at this time, the one or more programs would search for an object similar to the end of the weight that is the focal point 220 that rotates in accordance with the gesture (240). In order to determine how to apply the contextualized gesture to the area, in certain embodiments of the present invention, the one or more programs execute a semantic search in text and video to discover attributes describing the area, but with any additional qualities defined by the gesture (e.g., in the case of the example in FIG. 2, the one or more programs search for items with the shape of a weight, but that rotate). In an embodiment of the present invention, the user can further refine the search criteria for a follow up search, based on the area and the gesture, by utilizing additional movements to change the size, shape and dimension of one or more portions of the area of the image. Any changes made by the user based on these additional gestures are aggregated with the gesture and area as additional search criteria.

Returning to FIG. 4, the one or more programs perform an image search based on the determined application of the contextualized gesture to the area and the area (and any attributes of the area identified in a semantic search) (460). Because the one or more programs have identified the search requirements, the one or more programs can search for images whose properties match the contextual meaning of the body language or gesture captured (e.g., images having a similar image geometry to the area and a property that match what the body language indicated). The search results may include one or more images. In an embodiment of the present invention, the one or more programs rank the search results, based on relevance, given the contextual meaning of the body language and the image geometry of the area.

In an embodiment of the present invention, as part of the image search (460), and as demonstrated in FIG. 3, the one or more programs identify the one or more video clips demonstrating the gesture as related to the area. As seen in FIG. 3, the one or more programs display the video clips 320a-320b by overlaying the video clips 320a-320b on the image search results, such that the gesture (e.g., rotational feature 315a-315b) is integrated into the search results.

In an embodiment of the present invention, the one or more programs may repeat the method (returning to FIG. 4, 410), until the user accepts a search result. To aid in additional searching, in an embodiment of the present invention, based on additional gestures and future optical focus of a user, the one or more programs manipulate the search results further. The one or more programs interpret certain gestures as a request from the user to zoom-in, highlight, and/or zoom-out for each image.

Some embodiments of the present invention include one or more programs, executed by one or more processors, that monitor, via an image capture device communicatively coupled to the one or more processors, visual focus of a user to identify a focal point of a user on an area of an image displayed in a graphical user interface communicatively coupled to the one or more processors, where the image includes at least one object. The one or more programs derive shape geometry of the at least one object and utilizing the shape geometry to create a three-dimensional model of the at least one object. The one or more programs obtain, via the image capture device, a physical gesture by the user. The one or more programs perform a contextual analysis of the physical gesture, wherein the contextual analysis comprises determining, based on the three dimensional model, an application of the physical gesture to a portion of the at least one object depicted in the area of the image. The one or more programs formulate search criteria, based on determining the application of the physical gesture to the portion of the at least one object and the area of the image. The one or more programs execute a search based on the search criteria in at least one data source comprising images. The one or more programs display, in the graphical user interface, a search result of the search comprising at least one new image.

In an embodiment of the present invention, the physical gesture is selected from the group consisting of: a hand movement and a finger movement.

In an embodiment of the present invention, the one or more programs perform a contextual analysis by associating the physical gesture with a known meaning.

In an embodiment of the present invention, executing the search further includes identifying videos depicting the application of the physical gesture to the portion of the at least one object, and wherein the search result further comprises an input, wherein the selecting the input triggers the one or more processors to play the video. In an embodiment of the present invention, the one or more programs display these videos in the graphical user interface, wherein the displaying comprises overlaying the video on the at least one new image.

In an embodiment of the present invention, the search criteria include attributes describing an object visually similar to the portion of the at least one object depicted in the area of the image with a range of motion similar to a range of motion of the physical gesture.

In an embodiment of the present invention the one or more programs also monitor, via the image capture device communicatively coupled to the one or more processors, visual focus of the user to identify a new focal point of a user on an area of one image of the at least one new image displayed in the graphical user interface, wherein the one image comprises at least one other object. The one or more programs derive shape geometry of the at least one other object and utilizing the shape geometry to create a three-dimensional model of the at least one other object. The one or more programs obtain, via the image capture device, a new physical gesture by the user. The one or more programs perform a contextual analysis of the new physical gesture, where the contextual analysis comprises determining, based on the three dimensional model of the at least one new object, an application of the new physical gesture to a portion of the at least one new object depicted in the area of the one image. The one or more programs formulate additional search criteria, based on determining the application of the physical gesture to the portion of the at least one new object and the area of the one image. The one or more programs execute a second search based on the additional search criteria in at least one data source comprising images. The one or more programs display, in the graphical user interface, at least one additional image, comprising a search result of the second search.

In an embodiment of the present invention, the one or more programs also obtain, via the image capture device, a new physical gesture by the user. The one or more programs perform a contextual analysis of the new physical gesture. The one or more programs alter an appearance of the at least one new image in the graphical user interface based on the contextual analysis of the new physical gesture. The altering can include, but is not limited to, zooming in, zooming out, and/or re-sizing.

In an embodiment of the present invention, the at least one data source includes the Internet.

Referring now to FIG. 6, a schematic of an example of a computing node, which can be a cloud computing node 10. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove. In an embodiment of the present invention, the a computing device determining search criteria and conducting a search can be understood as cloud computing node 10 (FIG. 6) and if not a cloud computing node 10, then one or more general computing node that includes aspects of the cloud computing node 10.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system/server 12 that can be utilized as cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs). Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter). Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
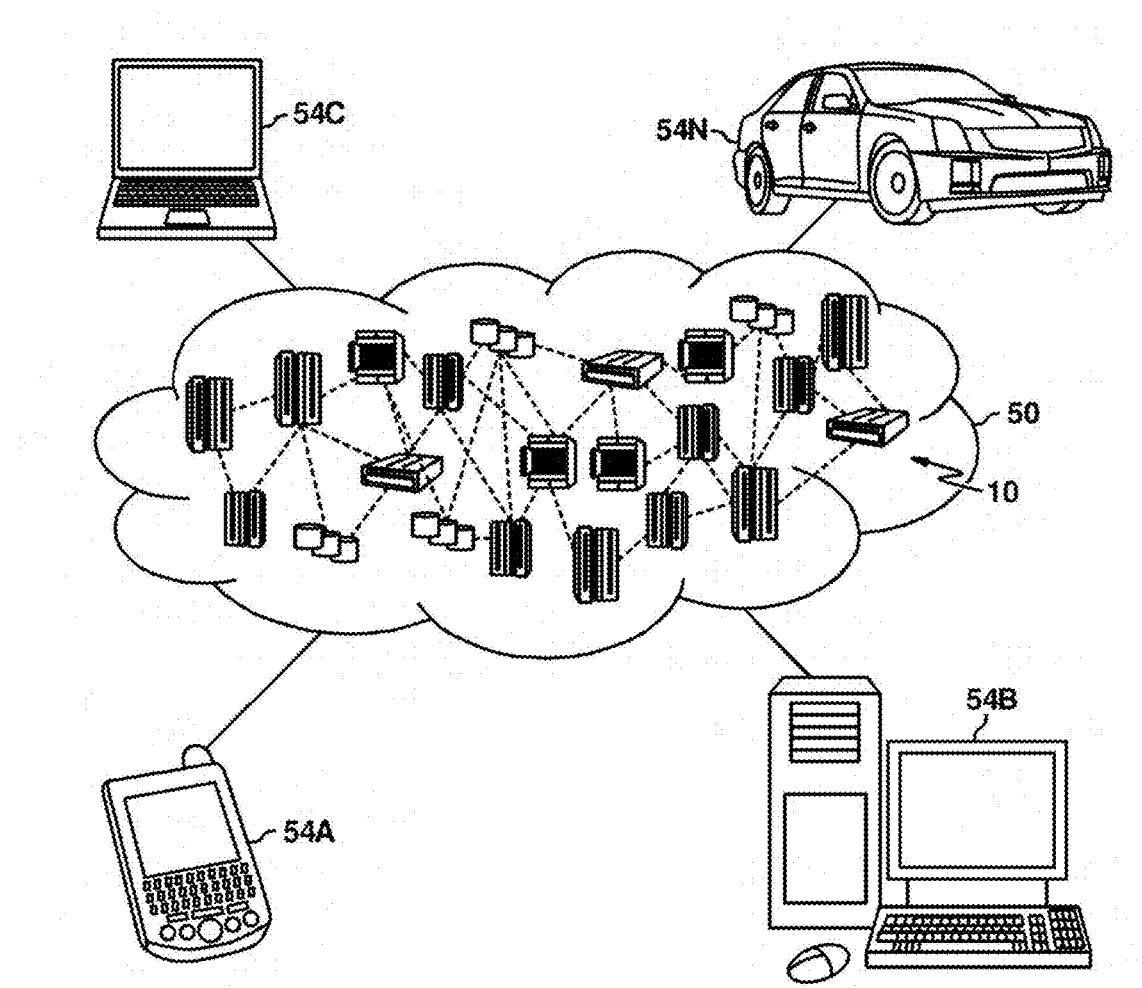
FIG. 7 depicts a cloud computing environment according to an embodiment of the present invention.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
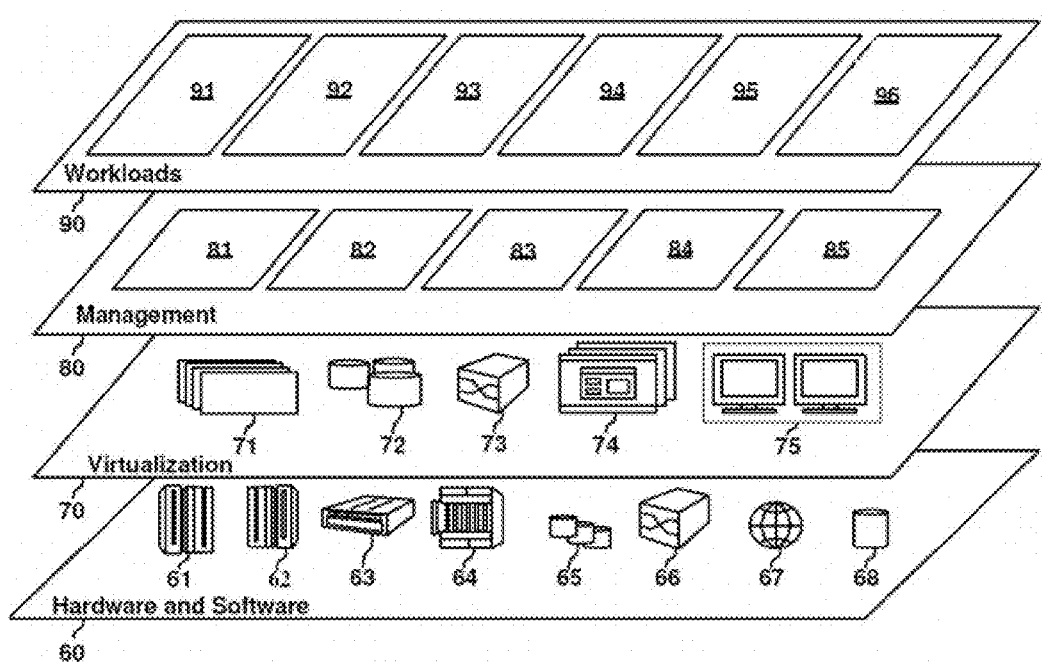
FIG. 8 depicts abstraction model layers according to an embodiment of the present invention.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and determining search criteria for an image search 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method, comprising:
monitoring, by one or more processors, via an image capture device communicatively coupled to the one or more processors, visual focus of a user to identify a focal point of the user on an area of an image displayed in a graphical user interface communicatively coupled to the one or more processors, wherein the image comprises at least one object and the area comprises at least one distinct portion of the object;
deriving, by the one or more processors, shape geometry of the at least one object and utilizing the shape geometry to create a three-dimensional model of the at least one object; obtaining, by the one or more processors, via the image capture device, a physical gesture by the user, wherein the physical gesture is a specific movement in three dimensional space;
performing, by the one or more processors, a contextual analysis of the physical gesture, wherein the contextual analysis comprises determining, based on the three dimensional model, an application of the physical gesture to the at least one distinct portion of the object depicted in the area of the image, such that applying the physical gesture to the at least one distinct portion of the object would move the at least one distinct portion of the object, relative to a remainder of the object, in accordance with the specific movement, in the three dimensional space;
determining, by the one or more processors, that in the three dimensional space, a range of motion of the object does not include moving the at least one distinct portion in accordance with the specific movement;
formulating, by the one or more processors, search criteria, wherein the search criteria comprise attributes describing an object visually similar to the at least one distinct portion capable of moving in accordance with the specific movement;
executing, by the one or more processors, a search based on the search criteria in at least one data source comprising images; and
displaying, by the one or more processors, in the graphical user interface, a search result of the search comprising at least one new image, wherein the at least one new image comprises at least one new object comprising a visual element similar to the at least one distinct portion, wherein the visual element is capable of moving in accordance with the specific movement.

2. The computer-implemented method of claim 1, wherein the physical gesture is selected from the group consisting of: a hand movement and a finger movement.

3. The computer-implemented method of claim 1, wherein executing the search further comprises identifying videos depicting the application of the physical gesture to the at least one distinct portion, and wherein the search result further comprises an input, wherein the selecting the input triggers the one or more processors to play the video.

4. The computer-implemented method of claim 3, further comprising:
displaying, by the one or more processors, the videos in the graphical user interface, wherein the displaying comprises overlaying the videos on the at least one new image.

5. The computer-implemented method of claim 1, further comprising:
monitoring, by the one or more processors, via the image capture device communicatively coupled to the one or more processors, visual focus of the user to identify a new focal point of a user on an area of one image of the at least one new image displayed in the graphical user interface, wherein the one image comprises at least one other object and the area of the one image comprises at least one distinct portion of the other object;
deriving, by the one or more processors, shape geometry of the at least one other object and utilizing the shape geometry to create a three-dimensional model of the at least one other object;
obtaining, by the one or more processors, via the image capture device, a new physical gesture by the user, wherein the new physical gesture is another specific movement in the three dimensional space;
performing, by the one or more processors, a contextual analysis of the new physical gesture, wherein the contextual analysis comprises determining, based on the three dimensional model of the at least one new object, an application of the new physical gesture to the at least one distinct portion of the new object depicted in the area of the one image, such that applying the new physical gesture to the at least one distinct portion of the new object would move the at least one distinct portion of the new object, relative to a remainder of the new object, in accordance with the other specific movement, in the three dimensional space;
determining, by the one or more processors, that in the three dimensional space, a range of motion of the object does not include moving the at least one distinct portion in accordance with the specific movement;
formulating, by the one or more processors, additional search criteria, wherein the search criteria comprise attributes describing an object visually similar to the at least one distinct portion of the new object capable of moving in accordance with the other specific movement;
executing, by the one or more processors, a second search based on the additional search criteria in at least one data source comprising images; and
displaying, by the one or more processors, in the graphical user interface, at least one additional image, comprising a search result of the second search, wherein the at least one additional image comprises at least one other new object comprising a new visual element similar to the at least one distinct portion of the new object, wherein the new visual element is capable of moving in accordance with the other specific movement.

6. The computer-implemented method of claim 1, comprising:
obtaining, by the one or more processors, via the image capture device, a new physical gesture by the user;
performing, by the one or more processors, a contextual analysis of the new physical gesture; and
altering, by the one or more processors, an appearance of the at least one new image in the graphical user interface based on the contextual analysis of the new physical gesture.

7. The computer-implemented method of claim 6, wherein the altering is selected from the group consisting of: zooming in, zooming out, and re-sizing.

8. The computer-implemented method of claim 1, wherein the at least one data source comprising images comprises the Internet.

9. A computer program product comprising:
a computer readable storage medium readable by one or more processors and storing instructions for execution by the one or more processors for performing a method comprising: monitoring, by the one or more processors, via an image capture device communicatively coupled to the one or more processors, visual focus of a user to identify a focal point of the user on an area of an image displayed in a graphical user interface communicatively coupled to the one or more processors, wherein the image comprises at least one object and the area comprises at least one distinct portion of the object;
deriving, by the one or more processors, shape geometry of the at least one object and utilizing the shape geometry to create a three-dimensional model of the at least one object, wherein the gesture is a specific movement in three dimensional space; obtaining, by the one or more processors, via the image capture device, a physical gesture by the user;
performing, by the one or more processors, a contextual analysis of the physical gesture, wherein the contextual analysis comprises determining, based on the three dimensional model, an application of the physical gesture to the at least one distinct portion of the object depicted in the area of the image, such that applying the physical gesture to the at least one distinct portion of the object would move the at least one distinct portion of the object in accordance with the specific movement, relative to a remainder of the object, in the three dimensional space;
determining, by the one or more processors, that in the three dimensional space, a range of motion of the object does not include moving the at least one distinct portion in accordance with the specific movement;
formulating, by the one or more processors, search criteria, wherein the search criteria comprise attributes describing an object visually similar to the at least one distinct portion capable of moving in accordance with the specific movement;
executing, by the one or more processors, a search based on the search criteria in at least one data source comprising images; and
displaying, by the one or more processors, in the graphical user interface, a search result of the search comprising at least one new image, wherein the at least one new image comprises at least one new object comprising a visual element similar to the at least one distinct portion, wherein the visual element is capable of moving in accordance with the specific movement.

10. The computer program product of claim 9, wherein the physical gesture is selected from the group consisting of: a hand movement and a finger movement.

11. The computer program product of claim 9, wherein executing the search further comprises identifying videos depicting the application of the physical gesture to the at least one distinct portion, and wherein the search result further comprises an input, wherein the selecting the input triggers the one or more processors to play the video.

12. The computer program product of claim 11, further comprising:
displaying, by the one or more processors, the videos in the graphical user interface, wherein the displaying comprises overlaying the videos on the at least one new image.

13. The computer program product of claim 11, further comprising:

monitoring, by the one or more processors, via the image capture device communicatively coupled to the one or more processors, visual focus of the user to identify a new focal point of a user on an area of one image of the at least one new image displayed in the graphical user interface, wherein the one image comprises at least one other object and the area of the one image comprises at least one distinct portion of the other object;
deriving, by the one or more processors, shape geometry of the at least one other object and utilizing the shape geometry to create a three-dimensional model of the at least one other object;
obtaining, by the one or more processors, via the image capture device, a new physical gesture by the user, wherein the new physical gesture is another specific movement in the three dimensional space;
performing, by the one or more processors, a contextual analysis of the new physical gesture, wherein the contextual analysis comprises determining, based on the three dimensional model of the at least one new object, an application of the new physical gesture to the at least one distinct portion of the new object depicted in the area of the one image, such that applying the new physical gesture to the at least one distinct portion of the new object would move the at least one distinct portion of the new object, relative to a remainder of the new object, in accordance with the other specific movement, in the three dimensional space;
determining, by the one or more processors, that in the three dimensional space, a range of motion of the object does not include moving the at least one distinct portion in accordance with the specific movement;
formulating, by the one or more processors, additional search criteria, wherein the search criteria comprise attributes describing an object visually similar to the at least one distinct portion of the new object capable of moving in accordance with the other specific movement;
executing, by the one or more processors, a second search based on the additional search criteria in at least one data source comprising images; and
displaying, by the one or more processors, in the graphical user interface, at least one additional image, comprising a search result of the second search, wherein the at least one additional image comprises at least one other new object comprising a new visual element similar to the at least one distinct portion of the new object, wherein the new visual element is capable of moving in accordance with the other specific movement.

14. The computer program product of claim 9, the method further comprising:
obtaining, by the one or more processors, via the image capture device, a new physical gesture by the user;
performing, by the one or more processors, a contextual analysis of the new physical gesture; and
altering, by the one or more processors, an appearance of the at least one new image in the graphical user interface based on the contextual analysis of the new physical gesture.

15. The computer program product of claim 14, wherein the altering is selected from the group consisting of: zooming in, zooming out, and re-sizing.

16. A system comprising:
a memory;
one or more processors in communication with the memory; and program instructions executable by the one or more processors via the memory to perform a method, the method comprising:

monitoring, by the one or more processors, via an image capture device communicatively coupled to the one or more processors, visual focus of a user to identify a focal point of the user on an area of an image displayed in a graphical user interface communicatively coupled to the one or more processors, wherein the image comprises at least one object and the area comprises at least one distinct portion of the object;

deriving, by the one or more processors, shape geometry of the at least one object and utilizing the shape geometry to create a three-dimensional model of the at least one object, wherein the gesture is a specific movement in three dimensional space;

obtaining, by the one or more processors, via the image capture device, a physical gesture by the user;

performing, by the one or more processors, a contextual analysis of the physical gesture, wherein the contextual analysis comprises determining, based on the three dimensional model, an application of the physical gesture to the at least one distinct portion of the object depicted in the area of the image, such that applying the physical gesture to the at least one distinct portion of the object would move the at least one distinct portion of the object in accordance with the specific movement, relative to a remainder of the object, in the three dimensional space;

determining, by the one or more processors, that in the three dimensional space, a range of motion of the object does not include moving the at least one distinct portion in accordance with the specific movement;

formulating, by the one or more processors, search criteria, wherein the search criteria comprise attributes describing an object visually similar to the at least one distinct portion capable of moving in accordance with the specific movement;

executing, by the one or more processors, a search based on the search criteria in at least one data source comprising images; and displaying, by the one or more processors, in the graphical user interface, a search result of the search comprising at least one new image, wherein the at least one new image comprises at least one new object comprising a visual element similar to the at least one distinct portion, wherein the visual element is capable of moving in accordance with the specific movement.

\* \* \* \* \*